United States Patent
Lin et al.

(10) Patent No.: US 8,134,139 B2
(45) Date of Patent: Mar. 13, 2012

(54) PROGRAMMABLE METALLIZATION CELL WITH ION BUFFER LAYER

(75) Inventors: Yu-Yu Lin, Taipei (TW); Feng-Ming Lee, Changhua (TW); Yi-Chou Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 243 days.

(21) Appl. No.: 12/692,861

(22) Filed: Jan. 25, 2010

(65) Prior Publication Data

US 2011/0180775 A1    Jul. 28, 2011

(51) Int. Cl.
*H01L 29/18* (2006.01)
*H01L 21/06* (2006.01)
*H01L 45/00* (2006.01)

(52) U.S. Cl. 257/4; 257/2; 257/3; 257/42; 257/E45.002; 257/E29.087; 257/E21.068; 438/102

(58) Field of Classification Search ........... 257/2, 3, 257/4, 42, E21.068, E29.087, E45.002; 438/102
See application file for complete search history.

(56) References Cited

U.S. PATENT DOCUMENTS

| | | | |
|---|---|---|---|
| 7,382,647 B1 | 6/2008 | Gopalakrishnan | |
| 7,704,789 B2 * | 4/2010 | Sun et al. | 438/104 |
| 2002/0123169 A1 | 9/2002 | Moore et al. | |
| 2005/0274942 A1 * | 12/2005 | Kozicki | 257/9 |
| 2006/0045974 A1 * | 3/2006 | Campbell et al. | 427/304 |
| 2007/0054453 A1 * | 3/2007 | Buh et al. | 438/261 |
| 2007/0164265 A1 * | 7/2007 | Kajiyama | 257/3 |
| 2008/0277708 A1 * | 11/2008 | Mun | 257/296 |
| 2011/0001108 A1 * | 1/2011 | Greene et al. | 257/2 |
| 2011/0001116 A1 * | 1/2011 | Greene et al. | 257/4 |
| 2011/0155990 A1 * | 6/2011 | Cheung et al. | 257/3 |
| 2011/0194339 A1 * | 8/2011 | Kozicki | 365/163 |

FOREIGN PATENT DOCUMENTS

WO    2009105203 A1    8/2009

OTHER PUBLICATIONS

Aratani, K., "A Novel Resistance Memory with High Scalability and Nanosecond Switching," IEEE IEDM 2007, Dec. 10-12, 2007 pp. 783-786.

(Continued)

*Primary Examiner* — Victor A Mandala
(74) *Attorney, Agent, or Firm* — Haynes Beffel & Wolfeld LLP

(57) ABSTRACT

A programmable metallization device, comprises a first electrode; a memory layer electrically coupled to the first electrode and adapted for electrolytic formation and destruction of a conducting bridge therethrough; an ion-supplying layer containing a source of ions of a first metal element capable of diffusion into and out of the memory layer; a conductive ion buffer layer between the ion-supplying layer and the memory layer, and which allows diffusion therethrough of said ions; and a second electrode electrically coupled to the ion-supplying layer. Circuitry is coupled to the device to apply bias voltages to the first and second electrodes to induce creation and destruction of conducting bridges including the first metal element in the memory layer. The ion buffer layer can improve retention of the conducting bridge by reducing the likelihood that the first metallic element will be absorbed into the ion supplying layer.

31 Claims, 6 Drawing Sheets

OTHER PUBLICATIONS

Cabral, C., et al., Irreversible modification of Ge2Sb2Te5 phase change material by nanometer-thin Ti adhesion layers in a device-compatible stack, Applied Physics Letters 90, 051908, Jan. 30, 2007, pp. 1-3.

Da Silva, Juarez L.F., et al., "Stability and electronic structures of CuxTe," Applied Physics Letters 91, 091902, Aug. 27, 2007, pp. 1-3.

Kozicki, M.N., "Programmable Metallization Cell Memory Based on Ag-Ge-S and Cu-Ge-S Solid Electrolytes," Non-Volatile Memory Technology Symposium, 10-10 Nov. 2005, pp. 83-89.

Kozicki, Michael N., "Non-Volatile Memory Based on Solid Electrolytes," Non-Volatile Memory Technology Symposium, Nov. 15-17, 2004, pp. 10-17.

Kozicki, Michael, et al., "Nanoscale Memory Elements Based on Solid-State Electrolytes," IEEE Transactions on Nanotechnology, vol. 4, No. 3, May 2005, 331-338.

Kund, Michael, et al., "Conductive bridging RAM (CBRAM): An emerging non-volatile memory technology scalable to sub 20nm," IEEE IEDM 2005, 5-5 Dec. 2005, pp. 754-757.

Sakamoto, T., et al., "Nonvolatile solid-electrolyte switch embedded into Cu interconnect," 2009 Symp. on VLSI Technology, Jun. 16-18, 2009, pp. 130-131.

Schindler, Christina, et al., "Bipolar and Unipolar Resistive Switching in Cu-Doped SiO2," IEEE Transacations on Electron Devices, vol. 54, No. 10, Oct. 2007, 2762-2768.

Waser, R., "Electrochemical and ThermoChemical Memories," IEEE IEDM, Dec. 15-17, 2008, pp. 1-4.

* cited by examiner

PROGRAMMABLE METALLIZATION CELL WITH ION BUFFER LAYER

BACKGROUND OF THE INVENTION

1. Field of the Invention

The present invention relates to programmable metallization cell technology.

2. Description of Related Art

Programmable Metallization Cell (PMC) technology for resistive switching is being investigated for use in nonvolatile memory, reconfigurable logic, and other switching applications due to its low current, good scalability, and high programming speed. The resistance switching of PMC devices is manifested by growing and removing conducting bridges through an electrochemical or electrolytic process. Therefore, PCM devices have also been referred to as conducting bridge CB devices or electro-chemical EC devices.

PMC devices, however, suffer from poor data retention and cycling endurance because the conducting bridge can be unstable.

SUMMARY OF THE INVENTION

A programmable metallization device, comprises a first electrode; a memory layer electrically coupled to the first electrode and adapted for electrolytic formation and destruction of a conducting bridge therethrough; an ion supplying layer containing a source of ions of a first metal element capable of diffusion into and out of the memory layer; a conductive ion buffer layer between the ion supplying layer and the memory layer, and which allows diffusion therethrough of said ions; and a second electrode electrically coupled to the ion supplying layer. Circuitry is coupled to the device to apply bias voltages to the first and second electrodes to induce creation and destruction of conducting bridges including the first metal element in the memory layer. The ion buffer layer can improve retention of the conducting bridge by reducing the likelihood that the first metallic element will be absorbed into the ion supplying layer, and thereby break the electrical connection of the conducting bridge with the ion supplying layer.

The ion supplying layer can comprises a chalcogen such as at least one of tellurium, selenium and sulfur. The first metal element can comprise at least one of silver, copper and zinc. The ion buffer layer can comprise a compound including said at least one of tellurium, selenium and sulfur and a refractory metal such as titanium.

In a general case, the ion buffer layer has a mixing enthalpy with the first metal element that is lower than a mixing enthalpy of said ion supplying layer with the first metal element. This can be accomplished using an ion supplying layer that comprises a compound containing the first metal element, which has an activation energy for formation in the ion supplying layer in combination with an ion buffer layer consisting essentially of materials having activation energy for bonding with the first metal element that is higher than the activation energy for formation of said compound in the ion supplying layer.

An intermediate conducting layer can be provided between said ion supplying layer and the second electrode to provide adhesion and/or barrier layer functions.

A method for manufacturing a programmable metallization device, basically comprises forming a first electrode; forming a memory layer electrically coupled to the first electrode and adapted for electrolytic formation and destruction of a conducting bridge therethrough; forming an ion supplying layer containing a source of ions of a first metal element capable of diffusion into and out of the memory layer; forming a conductive ion buffer layer between the ion supplying layer and the memory layer, and which allows diffusion therethrough of said ions; and forming a second electrode electrically coupled to the ion supplying layer.

One efficient method for manufacturing a programmable metallization device described herein, comprises forming a first electrode; forming a memory layer electrically coupled to the first electrode and adapted for electrolytic formation and destruction of a conducting bridge therethrough by an electrolytic reaction with an ion of a first metal element; depositing a metal layer on the memory layer, said metal layer not including the first metal element; depositing a chalcogenide on the metal layer; forming a second electrode electrically coupled to the chalcogenide; and annealing the metal layer and chalcogenide to form a compound between the memory layer and the chalcogenide including the metal from the metal layer and a chalcogen from the chalcogenide.

Other aspects and advantages of the present invention can be seen on review of the drawings, the detailed description and the claims, which follow.

DETAILED DESCRIPTION

A detailed description of embodiments of the present invention is provided with reference to the FIGS. 1-10.

Figure 1:
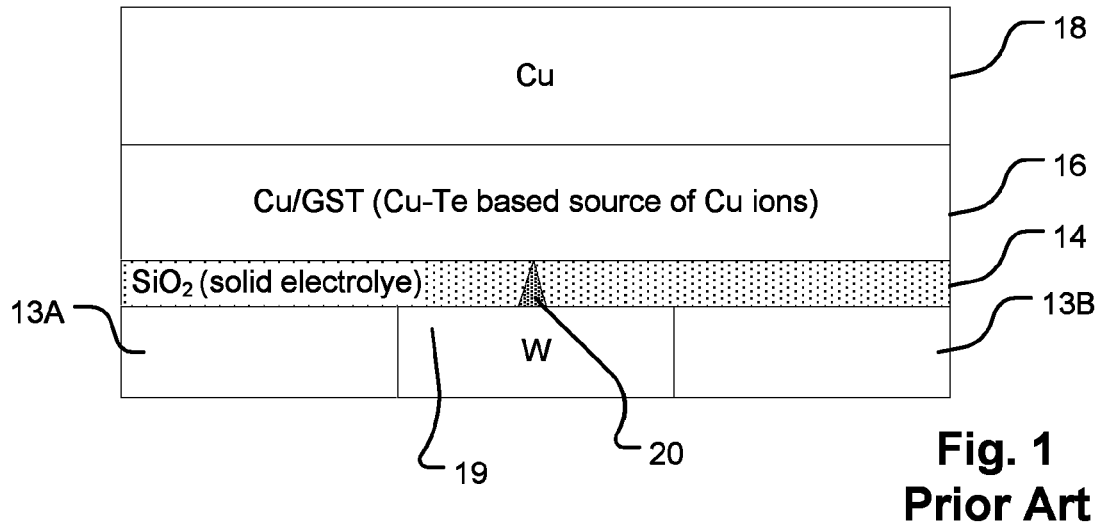
FIG. 1 is a drawing of a prior art programmable metallization cell.

FIG. 1 illustrates a prior art PCM cell, as proposed by Aratani et al., "A Novel Resistance Memory with High Scalability and Nanosecond Switching," IEEE International Electron Devices Meeting, 2007, 10-12 Dec. 2007, pp. 783-786. The cell in FIG. 1 is formed on an integrated circuit substrate that includes a dielectric layer (13A, 13B) with a tungsten contact 19 extending therethrough to provide a bottom electrode, and memory layer 14 of silicon dioxide, which acts as a solid electrolyte, is formed on the contact 19. An ion-supplying layer 16 of chalcogenide, such as $Ge_2Se_2Te_5$, overlies the layer 14 of silicon dioxide, and includes a source of metal ions such as copper. In this composition, the copper can react with the tellurium in the chalcogenide to form a Cu—Te compound which readily dissolves to release copper cations. Thus the layer 16 (referred to as an ion activated layer by Aratani et al.) acts as a source of copper cations for the cell. A top electrode 18, which can consist of copper or other metallization technology, overlies the layer 16. In operation, a bias is applied to the cell which causes the copper cations to migrate into the solid memory layer 14 and form a conducting bridge 20 by a process like electro-deposition. When the conducting bridge 20 has grown sufficiently to contact the chalcogenide layer 16, a low resistance state is achieved. In order to remove the conducting bridge 20, the structure is reversed biased causing the copper in the conducting bridge 20 to dissolve in the memory layer 14 and diffuse back to layer 16. When the conducting bridge 20 is broken, the high resistance state is restored.

Other PCM structures have been proposed based on other combinations of materials. These prior art structures can be operated to switch rapidly between the high resistance and low resistance states, and good cycling endurance has been achieved. However, data retention remains a significant issue for deployment in some applications.

Although the memory layer 14 is often implemented using a single material, multi-layer structures can be used for the memory layer as discussed in Sakamoto, et al. "Nonvolatile solid-electrolyte switch embedded into Cu interconnect," 2009 Symposium on VLSI Technology, 16-18 Jun. 2009, pp. 130-131, for example. Thus, references to the memory layer herein are intended to include such multi-layer structures.

As a reference, the $SiO_2$/Cu-GST dual layer structure has been evaluated. The $SiO_2$ layer serves as the memory layer, with an initial high resistance after the typical back-end-of-line BEOL process (400° C.). In set operation, a voltage is applied and Cu ions in the Cu—$Ge_2Sb_2Te_5$ (Cu-GST) source move into the $SiO_2$ memory layer and form a conducting path, resulting in the low resistance state (LRS). A reset operation forms the high resistance state (HRS) by dissolving and rupturing the Cu conducting path when the current is reversed. Although reasonable electrical properties have been demonstrated, the short retention time is a concern. This may occur because the activation energy for forming $CuTe_x$ from Cu is low. Therefore, Cu can easily dissolve into the Cu-GST at the interface and result in a sudden resistance increase from the LRS.

So, in the more general case, the low resistance state requires that the conducting bridge remain in place through the solid electrolyte. However, even under low bias the metal forming a conducting bridge can migrate back to the source layer 16. In the structure shown in FIG. 1, for example, the copper of the conducting bridge at the interface with the chalcogenide layer 16 can be consumed by reaction with the tellurium in the chalcogenide layer 16.

Figure 2:
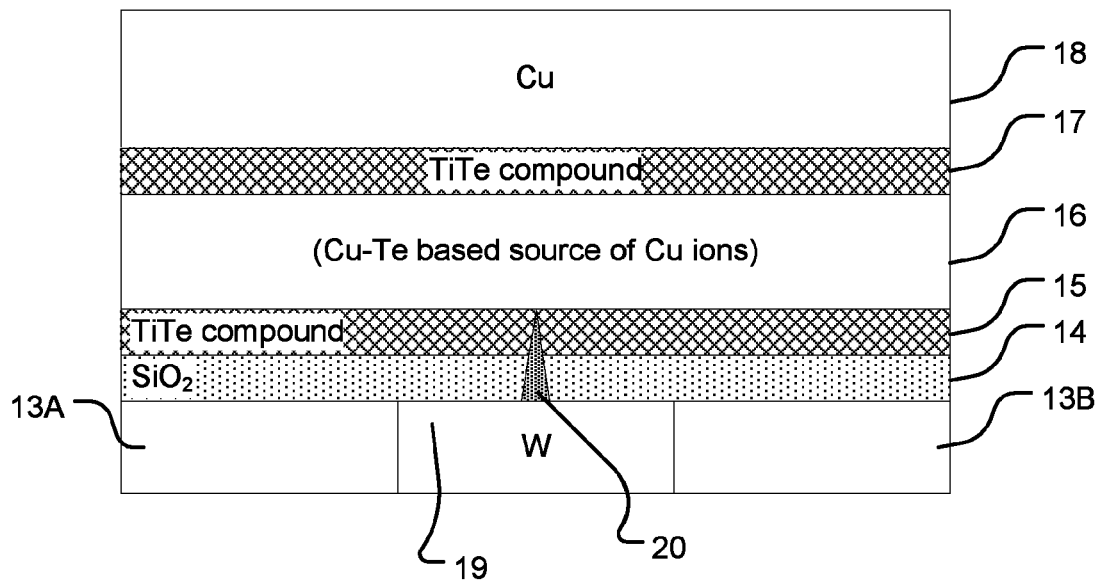
FIG. 2 is a drawing of an improvement over the cell shown in FIG. 1, by addition of an ion buffer layer.

FIG. 2 illustrates a modification of the prior art structure of FIG. 1. As shown in the figure, an ion buffer layer 15 is formed between the memory layer 14 and the ion-supplying layer 16. For an embodiment based on an ion-supplying layer 16 which comprises a Te-based chalcogenide with a copper additive, the ion buffer layer can comprise a titanium-tellurium compound. In this set of materials, the low resistance state is achieved when the conducting bridge 20 contacts the ion-supplying layer 16. However, the bridge 20 can extend through into the ion buffer layer 15 to the ion supplying layer 16 during the electrolytic growth process. As the metal, copper in this case, tends to react with the material, Te in this case, in the ion-supplying layer 16, the region in the ion buffer layer 15 at the interface can lose copper. However, the contact is maintained as the bridge 20 forms a contact with the conductive ion buffer layer 15.

FIG. 2 also illustrates an optional intermediate conducting layer 17, which lies between the ion-supplying layer 16 and the top electrode 18 and provides adhesion and/or barrier layer functions. The optional intermediate conducting layer 17 can improve adhesion between the ion-supplying layer and an overlying metal electrode, while allowing diffusion of the metal into the ion supplying layer during manufacture.

The ion buffer layer 15 acts to block the absorption of the metal from the conducting bridge into the ion-supplying layer 16. Keying on the reference system based on Cu-GST and $SiO_2$, an ion buffer layer 15 separates the Cu path in the $SiO_2$ layer from the ion-supplying layer. The ion buffer layer in the example is $TiTe_x$, chosen because it has low resistivity and the reaction rate between TiTe and Cu is very low at the operating voltages and temperature. In addition, $TiTe_x$ is readily formed by adding a Ti layer between the $SiO_2$ layer and the GST layer, and annealing.

The mechanism for operation of the ion buffer layer 15 can be explained based on the activation energy for formation of a Cu—Te bond in the GST (relatively low) compared to the activation energy for formation of the Cu—Te bond in the Ti—Te bond (relatively high). In this case, the ion buffer layer acts as a spacer making the probability of losing a Cu cation to the GST-based ion-supplying layer 16 much lower under low or zero bias conditions, and thereby improving retention of the conducting bridge.

A Cu-GST, Ti—Te, $SiO_2$ system was implemented, in which the memory layer of silicon dioxide was about 2.7 nanometers thick, a layer of titanium about 3.6 nanometers thick was deposited on the silicon dioxide, a layer of GST was formed on the titanium layer having a thickness of about 100 nanometers, a layer of titanium of about 1.8 nanometers is deposited on top of the GST layer, and a layer of copper acting as the top electrode was formed over the layer of titanium. The stack when subjected to a thermal treatment at about 400° C. for about 20 minutes during which the titanium reacted with the tellurium in the GST layer to form a ion buffer layer of Ti—Te compounds and an intermediate conducting layer of Ti—Te compounds on the bottom and top of the GST layer respectively. Also, copper cations diffused from the top electrode into the GST layer, and some of the cations reacted with the Te in the GST layer to form Cu—Te compounds which readily dissolve to supply copper cations under operating bias conditions. Tests of this Cu-GST, Ti—Te, $SiO_2$ based system showed that the device switches to LRS from HRS at 2.0V and the maximum current is 20 µA. The device switches back to HRS at ~1.0V and ~20 µA. The resistances of LRS and HRS are about 10 kΩ and 10MΩ, respectively. The device showed capability for high speed programming and low programming current. The initial resistance of a pristine device ranged from ~10MΩ to ~100MΩ and can be SET by a regular SET pulse, indicating a forming-free behavior where the working voltage of a first programming cycle is not substantially larger than that needed in subsequent programming cycles. A significant improvement in endurance was demonstrated in the tested devices, relative to the reference device without the ion buffer layer.

Thus, by inserting an ion buffer layer 15 between the ion-supplying layer 16 and the memory layer 14, the data retention is drastically improved. This forming-free device shows low programming current and high operation speed and much improved data retention and cycling endurance.

Figure 3:
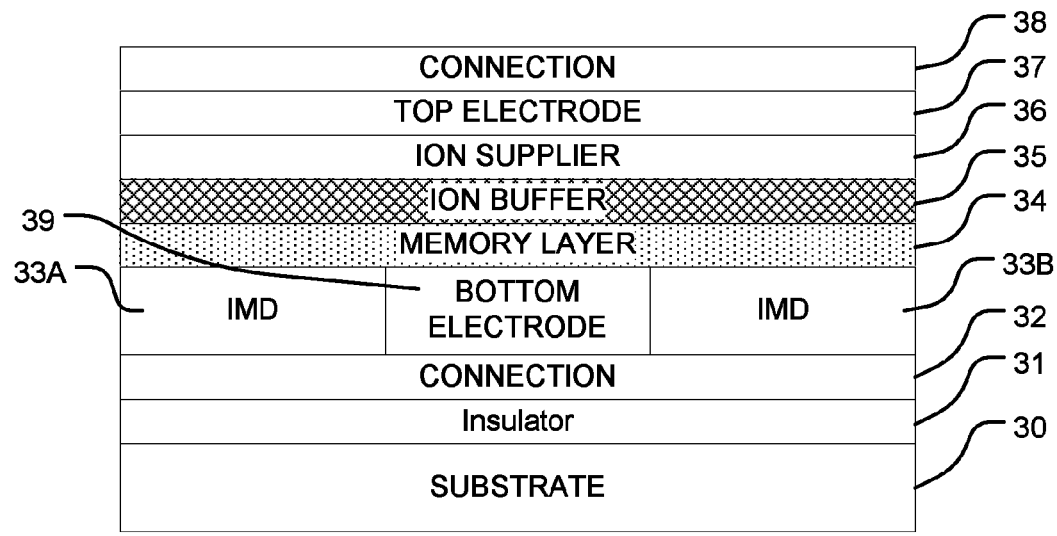
FIG. 3 illustrates a more general structure of a programmable metallization cell as described herein.

FIG. 3 illustrates a basic structure for a PMC cell including an ion buffer layer 35. The structure is formed on an integrated circuit substrate 30 which may include standard CMOS structures to implement circuits (not shown) such as control circuits, decoders, drivers and so on. An insulating layer 31 overlies the substrate 30. A connection 32, such as provided in a patterned metallization layer using copper or aluminum technologies overlies the insulating layer 31. An inter-metal dielectric layer including regions 33A and 33B in FIG. 3 overlies the connection 32. A bottom electrode 39, such as a tungsten plug extends through the inter-metal dielectric layer 33A, 33B and provides a contact surface on which a memory layer 34 is formed. The bottom electrode may comprise other inert electrode materials such as titanium nitride, aluminum, iridium, platinum, titanium and so on. A memory layer 34 such as silicon dioxide is formed on the contact surface of the bottom electrode 39. The memory layer 34 may comprise a variety of dielectrics, with common examples including silicon oxides, silicon nitrides, silicon carbonates, and a variety of metal oxides. An ion buffer layer 35 is formed on top of the memory layer 34. The ion buffer layer 35 can contain a compound of a refractory metal and a chalcogen (other than oxygen), exemplified by Ti—Te compounds, Ti—Se compounds, Ti—S compounds, Cr—Te compounds, Cr—Se compounds etc. Refractory metals include Ti, V, Cr, Zr, Nb, Mo, Hf, Ta, W and Re.

The ion buffer layer 35 can be formed by a thermal reaction, such as the transformation of the titanium layer into the Ti—Te compounds by thermal annealing as explained above. Also, the ion buffer layer 35 can be deposited directly on the structure, such as by sputtering the ion buffer material directly on the surface of the memory layer 34.

An ion-supplying layer 36 is formed on top of the ion buffer layer 35. The ion-supplying layer 36 can comprise a chalcogenide like $Ge_2Se_2Te_5$ (referred to herein as GST) with a metal suitable for acting as cations in the electrolytic process such as copper, silver, zinc, and suitable transition metals.

A top electrode 37 contacts the ion-supplying layer 36. The top electrode can include the metal such as copper, silver, zinc or other suitable transition metal, and act as a source of such metal for the ion supplying layer 36. A connection 38, such as a patterned metallization layer, is formed over the top electrode 37 in this example. Alternatively, the top electrode 37 could be part of a patterned metallization layer itself.

The bottom electrode 39 and top electrode 37 may include a multilayer structure including a diffusion barrier layer such as titanium nitride, tantalum nitride, tungsten nitride etc., and a conductive layer such as the inert metals preferred for the bottom electrode and the transition metal preferred for the top electrode.

Figure 4:
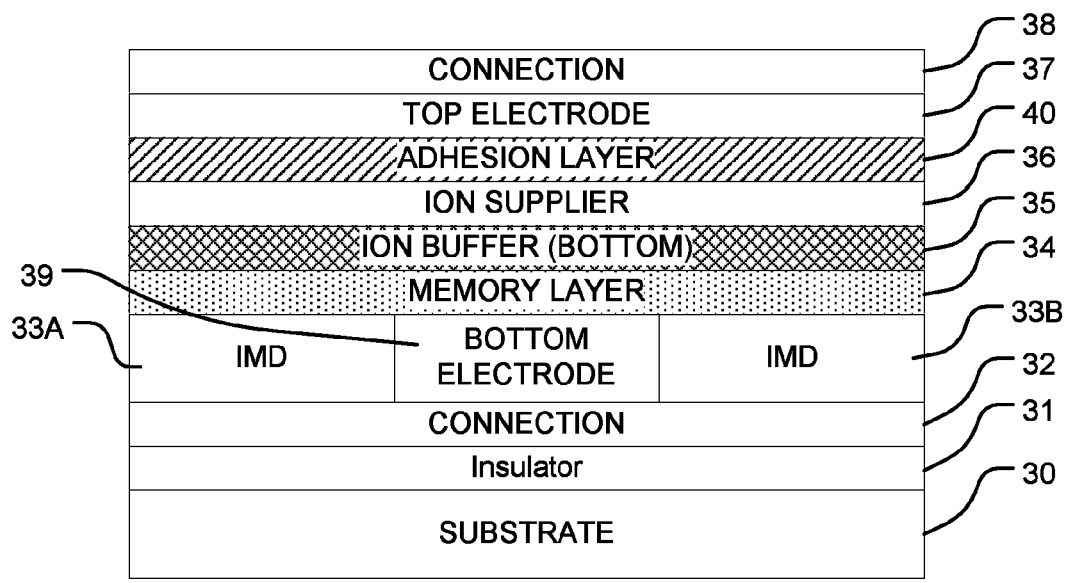
FIG. 4 illustrates an alternative general structure of a programmable metallization cell as described herein.

FIG. 4 illustrates an embodiment in which an intermediate conducting layer 40 is added between the ion supplying layer 36 and a top electrode 37. The intermediate conducting layer 40 can be made of the same material in some embodiments as is used for the ion buffer layer 35. Alternatively, other intermediate conducting layers can be selected to match the materials chosen for the ion-supplying layer 36 and a top electrode 37. The other components of FIG. 4 are the same as those discussed above with reference to FIG. 3.

A variety of materials can be utilized as the ion buffer layer 35. Generally, the ion buffer layer should have mixing enthalpy with the ions (and the non-ionic metal) used in the electrolytic process for creating and destroying the conductive bridge, that is much higher than the mixing enthalpy with the ion-supplying layer, while allowing diffusion of the ions therethrough. In this way, the buffer layer is unlikely to accumulate the ions and metal during operation, while allowing the ions to move between the memory layer and the ion supplying layer as necessary. Basic characteristics of materi als preferred for use as an ion buffer layer 35 include the following:

(1) The material of the ion buffer layer 35 should not impede diffusion of the cations. This suggests that it needs to be thin or glass-like, or both.

(2) The material of the ion buffer layer 35 should be conductive, so that it does not significantly increase the "on" resistance of the cell, and so that the low resistance state of the cell is established when the conducting bridge makes a contact with the ion buffer layer 35.

(3) The material of the ion buffer layer 35 should not react with the cations in a way that tends to rob the electro-deposited metal from the conducting bridge.

(4) The material of the ion buffer layer 35 should not be absorbed by the ion supplying layer 36.

Generally, the base material of the ion-supplying layer should have a mixing enthalpy that is much lower than the mixing enthalpy between the material of the ion buffer layer and the ions, and accumulate the metal in a form that is readily dissolved into the ionic form needed for the electrolytic process. Basic characteristics of materials preferred for use as the ion supplying layer 36, include:

(1) The material of the ion supplying layer 36 should be a conductive (e.g. chalcogenide in the crystalline phase).

(2) The material of the ion supplying layer 36 should allow rapid diffusion of the cations under the bias conditions for program and erase (such as a glass or glass like material) into the memory dielectric layer (order of nanoseconds in some embodiments).

(3) Compounds formed between elements of the material of the ion supplying layer 16 and the cations in the ion supplying layer 36 (e.g. Cu—Te) should have relatively weak bonds, so that the cations are not trapped in the ion supplying layer 36.

Although compounds like GST or other chalcogenides can provide the ion supplying function as discussed above, the ion supplying layer can also include a pure metal or alloy that includes the metal used in the electrolytic process for creating and destroying the conductive bridge. The materials chosen as the ion buffer layer can be matched to the ion supplying layer to provide the improvement in retention described here.

Figures 5, 6:
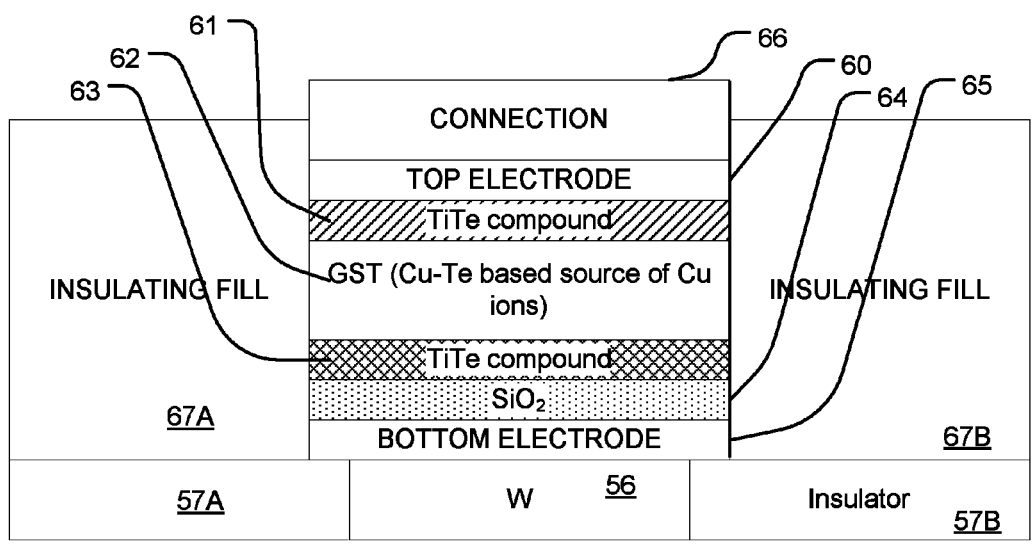
FIG. 5 illustrates a stage in a first manufacturing process for a programmable metallization cell as described herein.
FIG. 6 illustrates another stage in the first manufacturing process for a programmable metallization cell as described herein.

FIGS. 5 and 6 illustrate one method for manufacturing a programmable metallization cell with an ion buffer layer or as described herein. As seen in FIG. 5, at first stage a stack of materials is formed over a layer in the integrated circuit includes an array of contacts, including the contact 56, which are exposed at the surface of an insulating layer including insulators 57A and 57B. The stack of materials includes a bottom electrode/diffusion barrier layer 55 such as a layer of titanium nitride on the order of a few nanometers thick. Next, a memory layer 54 comprising for example silicon dioxide on the order of a few nanometers thick, is formed on the bottom electrode/diffusion barrier layer 55. A layer 53 of refractory metal, such as titanium on the order of a few nanometers thick in this example, is deposited over the memory layer 54. Next, a layer 52 of a base material for the ion-supplying layer, such as GST on the order of 100 nanometers thick, is deposited on the layer 53 of refractory metal. In a next step, a layer 51 of refractory metal such as titanium, is deposited over the layer 52. Finally, a top electrode/diffusion barrier structure 50 is formed over the layer 51 of refractory metal.

In FIG. 6, the structure after a patterning step and an anneal at about 400° C. for 20 minutes is illustrated. The structure is patterned to define a stack for each memory cell, and then an insulating fill 67A, 67B is applied. Next, a patterned connection 66 is added to provide for connecting the memory cell to supporting circuitry. The anneal can occur at any suitable stage in the process, including before or after the patterning step. The resulting structure includes the contact 56 in the insulator 57A, 57B. The bottom electrode 65 overlies the contact 56. The memory layer 64 consists of silicon dioxide. The ion buffer layer 63 and an intermediate conducting layer 61 contain titanium-tellurium compounds, formed by reaction with the tellurium in the GST base material for the ion-supplying layer. The ion-supplying layer 62 includes GST with copper-tellurium compounds formed by as result of copper which diffuses from the top electrode into the layer 63 during the anneal. The intermediate conducting layer 61 separates the ion-supplying layer 52 from the top electrode 60. The top electrode 60 provides for a good electrical contact with the connection 66.

The copper concentration in the ion-supplying layer 62 should be relatively rich. In this system of materials, the copper-tellurium compounds easily dissolve into copper cation under the bias conditions used for transition to the low resistance state. The chalcogen GST used in this example includes tellurium and the top electrode includes copper, providing a copper-tellurium system.

As mentioned above in alternative manufacturing processes, the titanium-tellurium compounds and the chalcogenide ion supplying layer with copper additives can be deposited directly, rather than implemented using a thermal anneal and diffusion process described above. Also, as mentioned above, the ion-supplying layer 62 could be implemented with a pure metal source, or other ion source material, rather than the metal-chalcogen compound basis structure described here.

An embodiment of a CMOS compatible Cu-based programmable metallization cell (PMC) has been fabricated and characterized. The new device consists of a Cu-doped GeSbTe ion source, a SiO2 memory layer, and a TiTe ion buffer layer. The ion-buffer layer separates the Cu conducting path from the Cu-ion supply layer thus greatly increases the stability. This tri-layer device greatly improved reliability, yet maintains both low thermal budget BEOL processing and excellent electrical properties.

Figure 7:
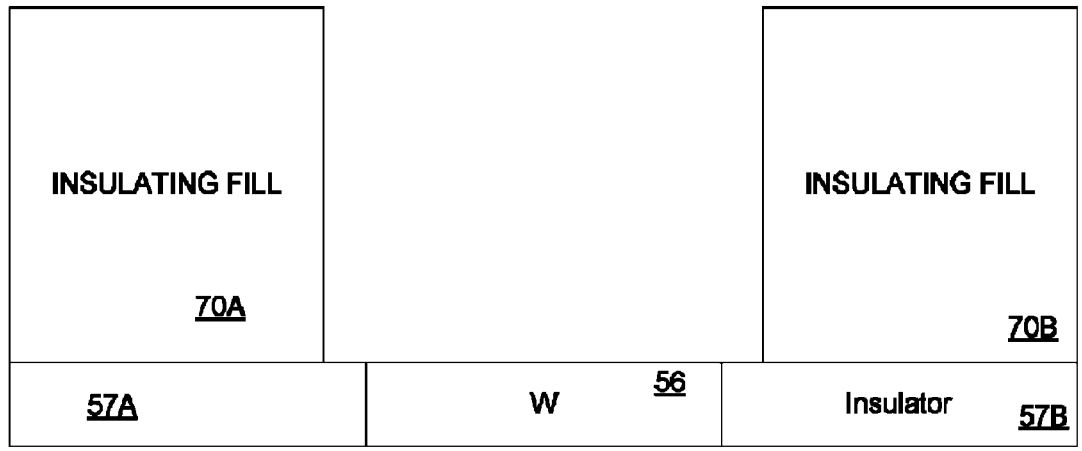
FIG. 7 illustrates a stage in a second manufacturing process for a programmable metallization cell as described herein.
Figure 8:
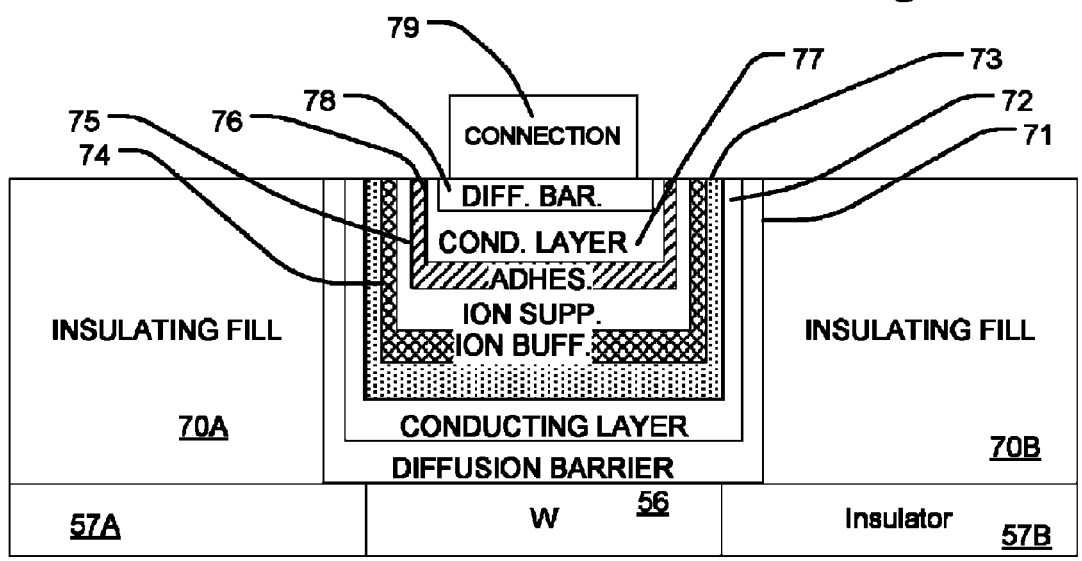
FIG. 8 illustrates another stage in the second manufacturing process for a programmable metallization cell as described herein.

FIGS. 7 and 8 illustrate an alternative approach to forming the memory cell using any "via-filling" process. As illustrated in FIG. 7, the process may include forming an insulating layer 70A, 70B over the layer 57A, 57B of insulator in which the contact 56 is formed. Then, vias are formed in the insulating layer 70A, 70B, exposing the contact 56. Layers of material acting as the diffusion barrier 71, conducting layer 72, memory layer 73, ion buffer layer 74, ion supplying layer 75, intermediate conducting layer 76, conducting layer 77 for the top electrode and a diffusion barrier 78 are formed, in a manner which results in lining the vias as shown. Then, the resulting structure is planarized to provide a smooth upper surface, and a connection 79, such as a patterned metallization layer is added. The materials and deposition steps used in this process can be similar to those discussed above with respect to the process of FIGS. 5 and 6.

Figure 9:
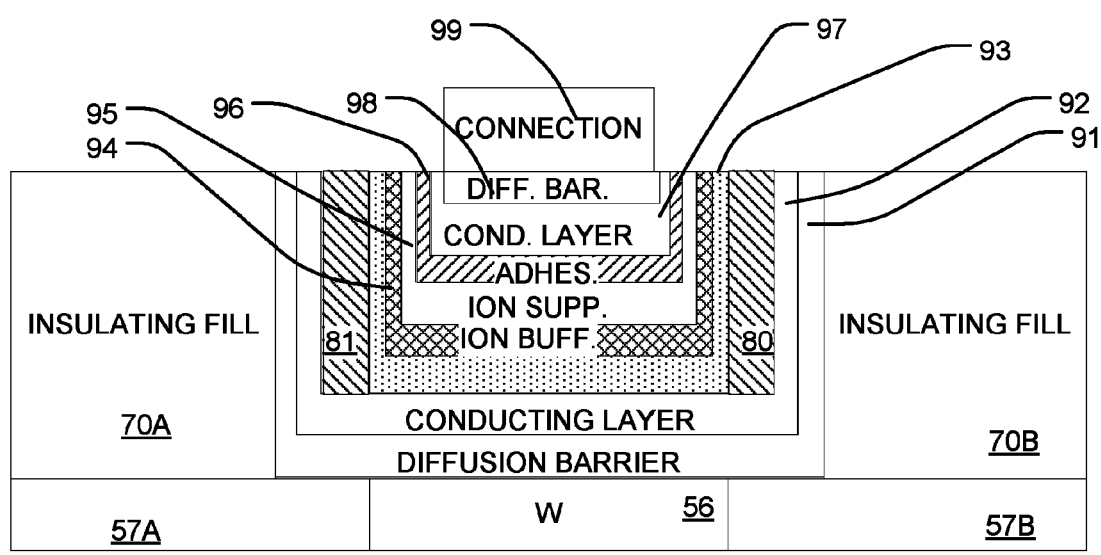
FIG. 9 illustrates an alternative process for manufacturing a programmable metallization cell as described herein, with the addition of a spacer layer.

FIG. 9 illustrates an alternative "via-filling" process, in which spacer 81, 80 completely or partially surrounding the memory stack, is formed over a conducting layer 92 beneath the memory layer 93. As in the embodiment of FIG. 8, layers of material acting as a diffusion barrier 91 and conducting layer 92 are deposited in a manner that lines the vias. Next, spacers 81, 80 are formed by applying a conforming deposition of a spacer material such as silicon nitride, silicon oxide or the like, followed by anisotropic etching until the spacer material is removed from the bottom and top of the structure. Then, materials are added for an ion buffer layer 94, ion-supplying layer 95, intermediate conducting layer 96, conductive layer 97, and diffusion barrier 98. After formation of the diffusion barrier 98, the process is planarized. Then connection 99 is formed and connecting the memory cell to supporting circuitry.

Figure 10:
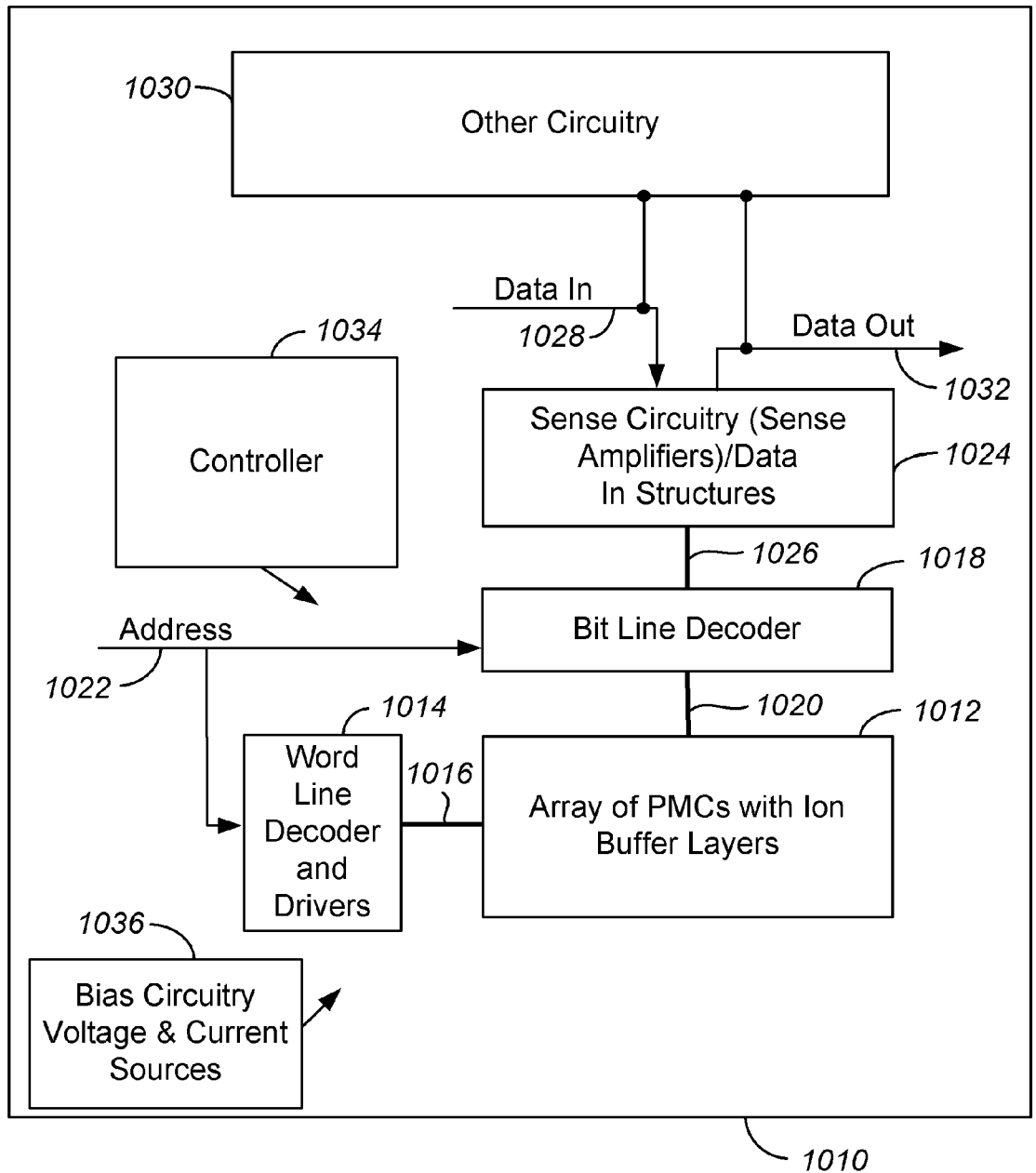
FIG. 10 is a simplified drawing of an integrated circuit memory device based on programmable metallization cells with ion buffer layers.

FIG. 10 is a simplified block diagram of an integrated circuit 1010 including a memory array 1012 implemented using programmable metallization memory cells having ion buffer layers as described herein. A word line decoder 1014 having read, set and reset modes is coupled to and in electrical communication with a plurality of word lines 1016 arranged along rows in the memory array 1012. A bit line (column) decoder 1018 is in electrical communication with a plurality of bit lines 1020 arranged along columns in the array 1012 for reading, setting, and resetting the phase change memory cells (not shown) in array 1012. Addresses are supplied on bus 1022 to word line decoder and drivers 1014 and bit line decoder 1018. Sense circuitry (Sense amplifiers) and data-in structures in block 1024, including voltage and/or current sources for the read, set, and reset modes are coupled to bit line decoder 1018 via data bus 1026. Data is supplied via a data-in line 1028 from input/output ports on integrated circuit 1010, or from other data sources internal or external to integrated circuit 1010, to data-in structures in block 1024. Other circuitry 1030 may be included on integrated circuit 1010, such as a general purpose processor or special purpose application circuitry, or a combination of modules providing system-on-a-chip functionality supported by array 1012. Data is supplied via a data-out line 1032 from the sense amplifiers in block 1024 to input/output ports on integrated circuit 1010, or to other data destinations internal or external to integrated circuit 1010.

A controller 1034 implemented in this example, using a bias arrangement state machine, controls the application of bias circuitry voltage and current sources 1036 for the application of bias arrangements including read, program, erase, erase verify and program verify voltages and/or currents for the word lines and bit lines. In addition, bias arrangements for melting/cooling cycling may be implemented as mentioned above. Controller 1034 may be implemented using special-purpose logic circuitry as known in the art. In alternative embodiments, controller 1034 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 1034.

The example in FIG. 10 is a memory device. Alternatively, the programmable metallization cell can be used for other memory and rectifier applications, including configuration memory in programmable logic devices such as field programmable gate arrays.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:
1. A programmable metallization device, comprising:
a first electrode;
a memory layer electrically coupled to the first electrode;
an ion-supplying layer containing a source of ions of a first metal element capable of diffusion into and out of the memory layer;

a conductive ion buffer layer between the ion-supplying layer and the memory layer, and which allows diffusion therethrough of said ions; and a second electrode electrically coupled to the ion-supplying layer.

2. The memory device of claim 1, wherein the memory layer is adapted for electrolytic formation and destruction of a conducting bridge therethrough, and including circuitry to apply bias voltages to the first and second electrodes to induce creation and destruction of conducting bridges including the first metal element in the memory layer.

3. The memory device of claim 1, including an intermediate conducting layer between said ion-supplying layer and the second electrode.

4. The memory device of claim 1, wherein said ion-supplying layer comprises a chalcogenide.

5. The memory device of claim 1, wherein said ion buffer layer comprises a metal different than the first metal element and a chalcogen.

6. The memory device of claim 1, wherein said memory layer comprises a dielectric.

7. The memory device of claim 1, wherein said memory layer comprises at least one of silicon oxide and silicon nitride.

8. The memory device of claim 1, wherein said ion-supplying layer comprises at least one of tellurium, selenium and sulfur; the first metal element comprises at least one of silver, copper and zinc; and the ion buffer layer comprises a compound including said at least one of tellurium, selenium and sulfur.

9. The memory device of claim 1, wherein said ion supplying layer comprises tellurium; the first metal element comprises copper, and the ion buffer layer comprises a compound of titanium and tellurium.

10. The memory device of claim 9, wherein the memory layer comprises silicon oxide.

11. The memory device of claim 1, wherein said ion buffer layer has a mixing enthalpy with the first metal element that is lower than a mixing enthalpy of said ion supplying layer with the first metal element.

12. The memory device of claim 1, wherein said ion-supplying layer comprises a compound containing the first metal element, which has an activation energy for formation in the ion supplying layer; and the ion buffer layer consists essentially of materials having activation energy for bonding with the first metal element that is higher than the activation energy for formation of said compound in the ion supplying layer.

13. A method for manufacturing a programmable metallization device, comprising:

forming a first electrode;

forming a memory layer electrically coupled to the first electrode;

forming an ion-supplying layer containing a source of ions of a first metal element capable of diffusion into and out of the memory layer;

forming a conductive ion buffer layer between the ion supplying layer and the memory layer, and which allows diffusion therethrough of said ions; and forming a second electrode electrically coupled to the ion supplying layer.

14. The method for manufacturing of claim 13, wherein the memory layer comprises a material adapted for electrolytic formation and destruction of a conducting bridge therethrough.

15. The method for manufacturing of claim 13, including forming an intermediate conducting layer between said ion supplying layer and the second electrode.

16. The method for manufacturing of claim 13, wherein said ion supplying layer comprises a chalcogenide.

17. The method for manufacturing of claim 13, wherein said ion buffer layer comprises a metal different than the first metal element and a chalcogen.

18. The method for manufacturing of claim 13, wherein said memory layer comprises a dielectric.

19. The method for manufacturing of claim 13, wherein said memory layer comprises at least one of silicon oxide and silicon nitride.

20. The method for manufacturing of claim 13, wherein said ion-supplying layer comprises at least one of tellurium, selenium and sulfur; the first metal element comprises at least one of silver, copper and zinc; and the ion buffer layer comprises a compound including said at least one of tellurium, selenium and sulfur.

21. The method for manufacturing of claim 13, wherein said ion-supplying layer comprises tellurium; the first metal element comprises copper, and the ion buffer layer comprises a compound of titanium and tellurium.

22. The method for manufacturing of claim 21, wherein the memory layer comprises silicon oxide.

23. The method for manufacturing of claim 13, wherein said ion buffer layer has a mixing enthalpy with the first metal element that is lower than a mixing enthalpy of said ion supplying layer with the first metal element.

24. The method for manufacturing of claim 13, wherein said ion-supplying layer comprises a compound containing the first metal element, which has an activation energy for formation in the ion-supplying layer; and the ion buffer layer consists essentially of materials having activation energy for bonding with the first metal element higher than the activation energy for formation of said compound in the ion supplying layer.

25. A method for manufacturing a programmable metallization device, comprising:

forming a first electrode;

forming a memory layer electrically coupled to the first electrode and adapted for electrolytic formation and destruction of a conducting bridge therethrough by an electrolytic reaction with an ion of a first metal element;

depositing a metal layer on the memory layer, said metal layer not including the first metal element;

depositing a chalcogenide on the metal layer;

forming a second electrode electrically coupled to the chalcogenide; and annealing the metal layer and chalcogenide to form a compound between the memory layer and the chalcogenide including the metal from the metal layer and a chalcogen from the chalcogenide.

26. The method for manufacturing of claim 25, wherein the second electrode includes the first metal element, and during said annealing, the first metal element diffuses into the chalcogenide.

27. The method for manufacturing of claim 25, including depositing another metal layer on the chalcogenide, and either during said annealing or during another annealing step, forming a compound between the other metal layer and the chalcogenide including a metal from the other metal layer and a chalcogen from the chalcogenide.

28. The method for manufacturing of claim 25, wherein said memory layer comprises a dielectric.

29. The method for manufacturing of claim 25, wherein said first metal element is one of copper, silver and zinc.

30. The method for manufacturing of claim 25, wherein said metal layer includes a refractory metal.

31. The method for manufacturing of claim 25, wherein said first metal element is one of copper, silver and zinc, the metal layer comprises titanium and the chalcogenide comprises tellurium.

* * * * *